United States Patent [19]
Elpers et al.

[11] Patent Number: 5,519,719
[45] Date of Patent: May 21, 1996

[54] UNIVERSAL PATTERN GENERATOR

[75] Inventors: Mark D. Elpers, Minneapolis; John C. Lanphear, Eden Prairie, both of Minn.

[73] Assignee: ADC Telecommunications, Inc., Minneapolis, Minn.

[21] Appl. No.: 810,207

[22] Filed: Dec. 19, 1991

[51] Int. Cl.$^6$ ................................................ G06F 11/00
[52] U.S. Cl. ............................................ 371/27; 371/20.1
[58] Field of Search ......................... 371/27, 22.1, 37.1, 371/39.1, 15.1, 21.3, 20.1, 20.5; 455/67.1, 67.4; 379/10; 375/10

[56] References Cited

U.S. PATENT DOCUMENTS

| | | | |
|---|---|---|---|
| 4,810,958 | 3/1989 | Mogi et al. | 324/73 R |
| 4,837,764 | 6/1989 | Russello | 371/20 |
| 4,964,124 | 10/1990 | Bunnett | 371/15.1 |
| 4,996,695 | 2/1991 | Dack et al. | 375/10 |
| 5,072,178 | 12/1991 | Matsumoto | 324/158 R |
| 5,265,089 | 11/1993 | Yonehara | 370/15 |

OTHER PUBLICATIONS

Operating Manual, Pattern Generator/Error Detector, 3780A, Hewlett Packard (1983), p. 28, ¶¶ 7 and 8.
Operating Manual, 3781B Pattern Generator, 3782B Error Detector, Hewlett Packard (1980), p. 3–3, ¶¶ 12 Through 15.
Programming Note, Quick Reference Guide for 3781B Pattern Generator and 3782B Error Detector (1980), p. 3.
Phoenix, 5575A T1 Micro BERT Test Set, Operation —Section 3 (1989), pp.3–74 through 3–77, §3–6 and pp. 3–86 through 3–88, § 3–8.
Operating Manual, T–BERD 211 T–Carrier Analyzer (1989), pp. 2–3, §2.3.1–1, pp. 2–3, §2.3.1–2, pp. 2–3, §2.3.1–13.
TE820A User's Manual, Tekelec (1988), pp. 4.3–7, §4.3, pp. 4.5–1 through 4.5–2, §4.5, pp. 4.5–5, §4.5, pp. 4.6–1 through 4.6–2, §4.6, pp. 4.6–5 through 4.6–8, §4.6, pp. 4.7–3 through 4.7–6, §4.7.
Operating Manual, 3776B PCM Terminal Test Set (Including Options 001, 002, and 004) Hewlett Packard (1984), pp.4–4, §4–24, pp. 4–4, §4–25, pp. 4–4, §4–27, pp. 4–5, §4–34, pp. 4–5, §4–35, pp. 4–5, §4–36, pp. 4–5, §4–37 pp.4–5, §4–38, pp. 4–5, §4–39, pp. 4–6, §4–40 pp. 4–6, §4–41, pp. 4–6, §4–42, pp. 4–9, §4–56, pp. 4–30, §4–123, pp. 4–30, §4–124, pp. 4–31, §4–129, pp. 4–31, §4–133, pp. 4–31, §4–134, pp. 4–31, §4–139, pp. 4–32, §4–144.
Bell Communications Research, Technical Reference TR–TSY–000008, entitled "Digital Interface Between the SLC 96 Digital Loop Carrier System and a Local Digital Switch" (1987), pp. 3–1 through 3–14, §3.
Bellcore, Technical Reference TR–TSY–000499, entitled "Transport Systems Generic Requirements (TSGR) : Common Requirements" (1988), pp. 9–1, §9.1.1.1, pp. 9–3 through 9–6, §9.1.2, pp. 9–7, §9.2, pp. 10–1 through 10–14, §10.2

*Primary Examiner*—Robert W. Beausoliel, Jr.
*Assistant Examiner*—Phung My Chung
*Attorney, Agent, or Firm*—Merchant, Gould, Smith, Edell, Welter & Schmidt

[57] ABSTRACT

A universal pattern generator generates a digital signal pattern. The generator includes a user programmable device for specifying a repeatable digital signal pattern. The programmable device allows for the selection of a framing structure having a number of channels. The programmable device also has input means for inputting data into the channels of the framing structure. A data set representing the repeatable digital signal pattern is generated. The data set is held in memory. A transmitter responsive to the data set held in memory repeatably transmits the repeatable digital signal pattern represented by said data set.

10 Claims, 7 Drawing Sheets

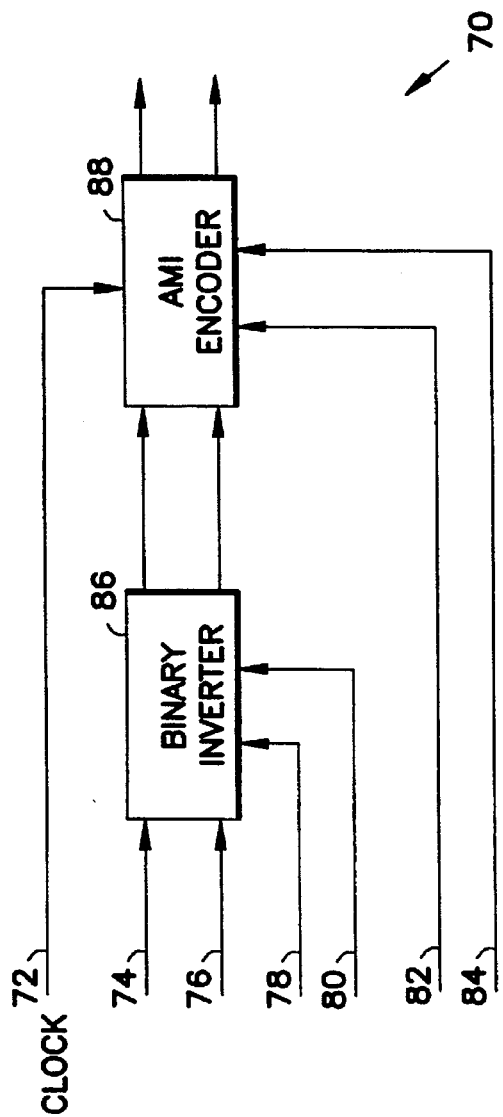
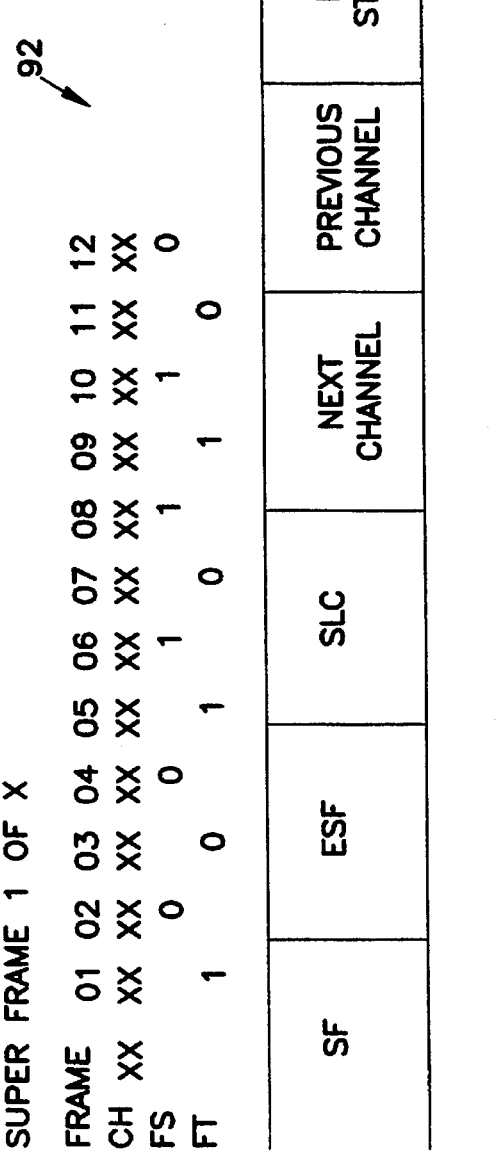

FIG. 6

SUPER FRAME 1 OF X

| FRAME | 01 | 02 | 03 | 04 | 05 | 06 | 07 | 08 | 09 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| CH | XX | XX | XX | XX | XX | XX | XX | XX | XX | XX | XX | XX | XX | XX | XX | XX | XX | XX | XX | XX | XX | XX | XX | XX |
| FE |  |  |  | 0 |  |  |  | 0 |  |  |  | 1 |  |  |  | 0 |  |  |  | 1 |  |  |  | 1 |
| CRC6 |  | x |  |  |  | x |  |  |  | x |  |  |  | x |  |  |  | x |  |  |  | x |  |  |
| FDL | x |  | x |  | x |  | x |  | x |  | x |  | x |  | x |  | x |  | x |  | x |  | x |  |

↙ 92

| SF | ESF | SLC | NEXT CHANNEL | PREVIOUS CHANNEL | EDIT STRUCT | MARK ERRORS | LOAD QRSS |
|---|---|---|---|---|---|---|---|

SUPER FRAME 1 OF X  ⟵92

| FRAME | 01 | 02 | 03 | 04 | 05 | 06 | 07 | 08 | 09 | 10 | 11 | 12 | 13 | 14 | 15 | 16 |
|---|---|---|---|---|---|---|---|---|---|---|---|---|---|---|---|---|
| CH | XX | XX | XX | XX | XX | XX | XX | XX | XX | XX | XX | XX | XX | XX | XX | XX |
| FS |   |   |   | 0 |   |   |   | 0 |   |   |   | 0 |   |   |   | 0 |
| FT | 1 | 0 |   |   | 1 |   | 0 |   | 1 |   | 0 |   | 1 |   | 0 |   |

| FRAME | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|
| CH | XX | XX | XX | XX | XX | XX | XX | XX | XX | XX | XX | XX | XX | XX | XX | XX |
| FDL | 1 | 0 | 1 | 1 | 1 | 1 | 1 | 1 | 1 | 1 | 1 | 0 | 1 | 1 | 0 | 1 |
| FT |   |   |   |   |   |   |   |   |   |   |   |   |   |   |   |   |

| FRAME | 33 | 34 | 35 | 36 | 37 | 38 | 39 | 40 |
|---|---|---|---|---|---|---|---|---|
| CH | XX | XX | XX | XX | XX | XX | XX | XX |
| FDL | 1 | 1 | 0 | 1 | 1 | 1 | 0 | 1 |

| FRAME | 41 | 42 | 43 | 44 | 45 | 46 | 47 | 48 | 49 | 50 | 51 | 52 | 53 | 54 | 55 | 56 |
|---|---|---|---|---|---|---|---|---|---|---|---|---|---|---|---|---|
| CH | XX | XX | XX | XX | XX | XX | XX | XX | XX | XX | XX | XX | XX | XX | XX | XX |
| FDL | 1 | 0 | 1 | 1 | 1 | 1 | 1 | 1 | 1 | 1 | 1 | 0 | 1 | 1 | 0 | 1 |
| FT |   |   |   |   |   |   |   |   |   |   |   |   |   |   |   |   |

| FRAME | 57 | 58 | 59 | 60 | 61 | 62 | 63 | 64 |
|---|---|---|---|---|---|---|---|---|
| CH | XX | XX | XX | XX | XX | XX | XX | XX |
| FDL | 1 | 1 | 0 | 1 | 1 | 1 | 0 | 1 |

| FRAME | 65 | 66 | 67 | 68 | 69 | 70 | 71 | 72 |
|---|---|---|---|---|---|---|---|---|
| CH | XX | XX | XX | XX | XX | XX | XX | XX |
| FS |   |   |   | 0 |   |   |   | 0 |
| FT | 1 | 0 |   |   | 1 |   | 0 |   |

| SF | ESF | SLC | NEXT CHANNEL | PREVIOUS CHANNEL | EDIT STRUCT | MARK ERRORS | LOAD QRSS |
|---|---|---|---|---|---|---|---|

PATTERN LENGTH: XX

FRAME       01 02 03 04 05 06 07 08 09 10 11 12 13 14 15 16 17 18 19 20 21 22 23 24
CH          XX XX XX XX XX XX XX XX XX XX XX XX XX XX XX XX XX XX XX XX XX XX XX XX

SIGNALLING   A  B  C  D                    NUMBER OF SUPER FRAMES:  XX
OFF          X  X  X  X

FDL PATTERN LENGTH:   XX

FDL BYTE   01 02 03 04 05 06 07 08 09
           XX XX XX XX XX XX XX XX XX

BPV   ERRORS OFF    XX
LOGIC ERRORS OFF    XX
FRAME ERRORS OFF    XX

| BOOT EMULATOR | AMI | NEXT CHANNEL | PREVIOUS CHANNEL | EDIT FRAMING | SAVE FILE | LOAD FILE |
|---|---|---|---|---|---|---|
| LOAD GEN B | SWITCH TO A | SWITCH TO B | SWITCH A-B-A | TRIGGER BPV | TRIGGER LOGIC | TRIGGER FER | ALT A-B-A-B |

90

UNIVERSAL PATTERN GENERATOR

TECHNICAL FIELD OF THE INVENTION

The present invention relates generally to telecommunication test systems. More particularly, the invention relates to pattern generators for use in telecommunication test systems.

BACKGROUND OF THE INVENTION

To develop and test telecommunications equipment, a myriad of transmitting equipment products have been utilized to generate and apply to the telecommunications equipment varying errored digital signal patterns. These various equipment products, while functional, do not have the flexibility or control to adequately generate the errored patterns necessary to thoroughly test the performance of telecommunications equipment. For example, the HP 3781, HP 3780, and HP 3782 pattern generators available from Hewlett-Packard offer high bit rates, but only provide SF superframing formats. Their error generation capabilities are limited to producing a single error occurrence over which the user has no timing control, and only a limited selection of error rates are possible. The Phoenix 5575A-T1 Micro BERT available from Phoenix offers framed format generation of various framing formats and line codes. Its error generation capabilities allow single error occurrence or error rate generation of line code and framing bits, however, it does not control which bits are errored. The T-Bird 211 T-Carrier Analyzer, available from T-Bird, can generate any number of consecutive frame bit errors, however, the generation of the errors is limited to the pressing of a switch which generates the errored frame, limiting the switching ability of generating a good frame and then an errored framed when desired. The Tekelec TEB-ZOA-DS1 Frame Simulator and Analyzer, available from Tekelec, provides various generating and erroring capabilities, but will not provide ZBTS1 line coding or the generation of Facility Data Link messages and lacks the control necessary to quickly switch between errored and unerrored generated patterns. In addition, errors can only be inserted into unerrored framed patterns, as opposed to inserting errors into an already errored pattern.

The various pattern generator products utilize hardware customized or specific to the assembly of the user specified channel content, framing, signal bits, etc. Therefore, when changes are made in the specifications of the framing patterns, data link formats, and the like, the products require hardware modifications to meet the new requirements. Thus, there is a need for a universal error pattern generator which provides flexible and detailed pattern control to test the performance of telecommunications equipment, and which could replace the myriad of pattern generator products now available.

SUMMARY OF THE INVENTION

The present invention is a system for generating digital signal patterns. The system is programmably controlled so the user has flexibility and detailed pattern control when testing the performance of telecommunications equipment. The system includes a user programmable device for specifying a repeatable digital signal pattern. The programmable device allows for selecting a framing structure having a plurality of channels, and includes an input for inputting data into the channels. A data set representing the repeatable digital signal pattern is generated. The data set is stored in memory and a transmitter responsive to the data set repeatedly transmits the repeatable digital signal pattern generating the digital signal pattern.

In one embodiment of the invention, the system allows for the selection of errors to be generated in the data of channels. Error data is generated corresponding to the errors selected and the data set generated has errors interjected therein as a function of the error data.

According to another embodiment of the invention error rates, bursts, or single errors are specified for the framing, logic, or line code of the repeatable digital signal pattern. Trigger circuitry interjects the rate, burst or single errors into the digital signal pattern.

According to another embodiment of the invention, an additional data set representing an additional repeatable digital signal pattern is stored in the memory. The input of the transmitter is switched between the data set for the repeatable digital signal pattern and the additional data set. The digital signal pattern represented by the data set and the additional pattern represented by the additional data set are alternately transmitted.

According to yet another embodiment of the invention, the input of the transmitter is switched between the data set for the repeatable digital signal pattern and the additional data set so that one iteration of either the digital signal pattern represented by the data set or the additional pattern represented by the additional data set is interjected into the transmittal of the other pattern.

BRIEF DESCRIPTION OF THE DRAWINGS

FIG. 4 is a block diagram of the AMI/ERROR/SELECT/PAL of the transmitter of FIG. 3; and FIGS. 5–9 are softkey menus and screen displays displayed during the use of the present invention.

DETAILED DESCRIPTION OF THE INVENTION

In the following detailed description of the invention, references are made to the accompanying drawings which form a part hereof, and which show by way of illustrations specific embodiments in which the invention may be practiced. It is to be understood that other embodiments may be utilized and structural changes may be made without departing from the scope of the present invention.

Figure 1:
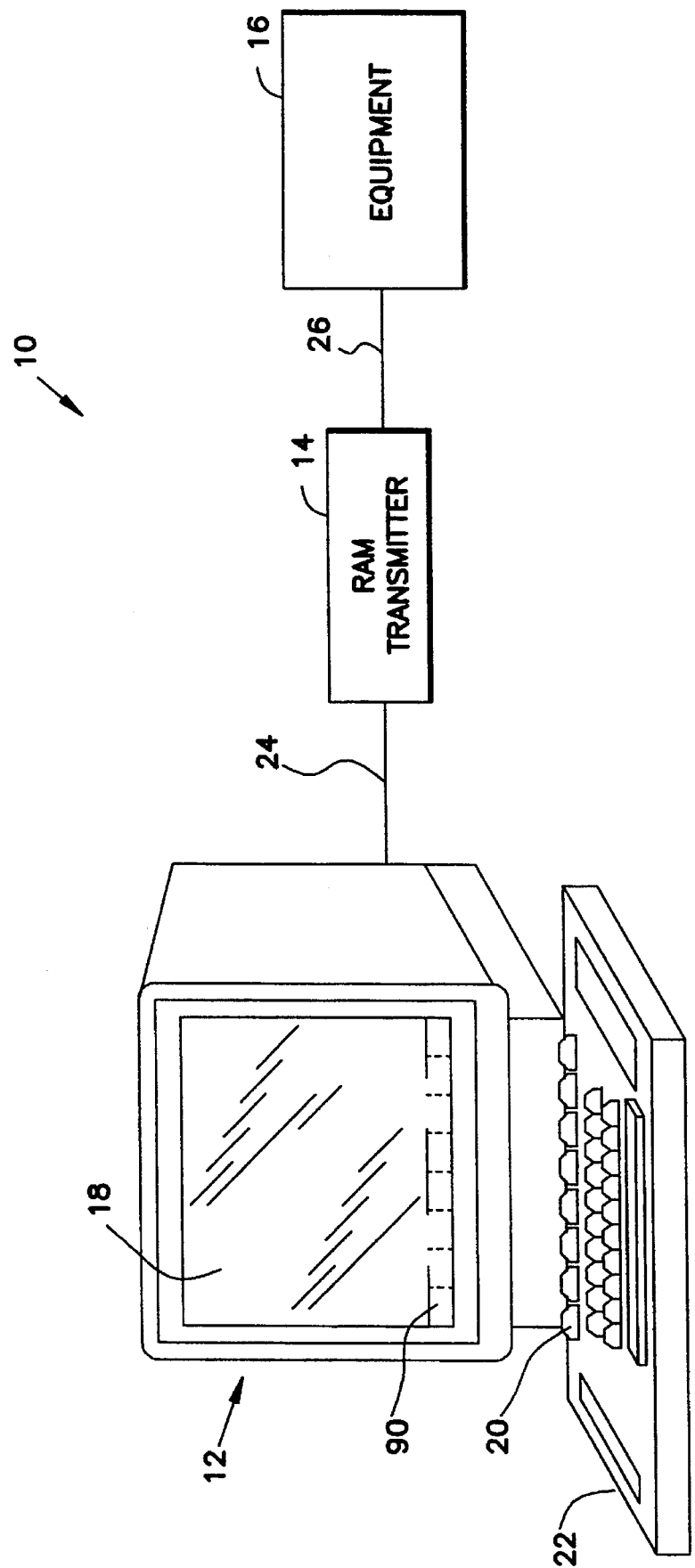
FIG. 1 is a perspective view showing the universal pattern generator of the present invention for use in testing telecommunications equipment.

Referring to FIGS. 1–9, the preferred embodiment of the Universal Pattern Generator of the present invention will be described. FIG. 1 shows a perspective view of the Universal Pattern Generator 10 coupled to test equipment units 16. Generator 10 includes a user-programmable unit 12, including a computer or microprocessor and having a display 18, softkeys 20 (and corresponding softkey display 90) and other input keys 22. The user programmable unit 12 allows the user to specify a repeatable digital signal pattern and error the data in that pattern as will be described in detail below.

The user programmable unit 12 generates a data set representing an errored or unerrored repeatable digital signal pattern and the data set is stored in memory of a RAM based transmitter 14 via bus 24, a multi-bus in the preferred embodiment. The transmitter 14 is responsive to the data set stored in the memory and repeatedly transmits the repeatable digital signal pattern represented by the data set by continuously resetting a counter for addressing the memory of the RAM based transmitter 14. Thus, the errored or unerrored digital signal pattern is generated, transmitted, and applied via line 26 to equipment units 16. The generator provides universal unerrored or errored T1 pattern generation and is capable of adding new features and generating new patterns therewith by creating new software, without redesigning the hardware of the generator. It will be recognized by those skilled in the art that T-1 refers to specific telecommunications networks for transmitting data over specific framing structures and timings and is well recognized by those skilled in the art. A more detailed description of such networks and the framing structure and timing of signals carried on such networks is disclosed in Bellcore Technical Reference TR-TSY-000499, "Transport Systems Generic Requirements (TSGR): Common Requirements", 1988.

Figure 2:
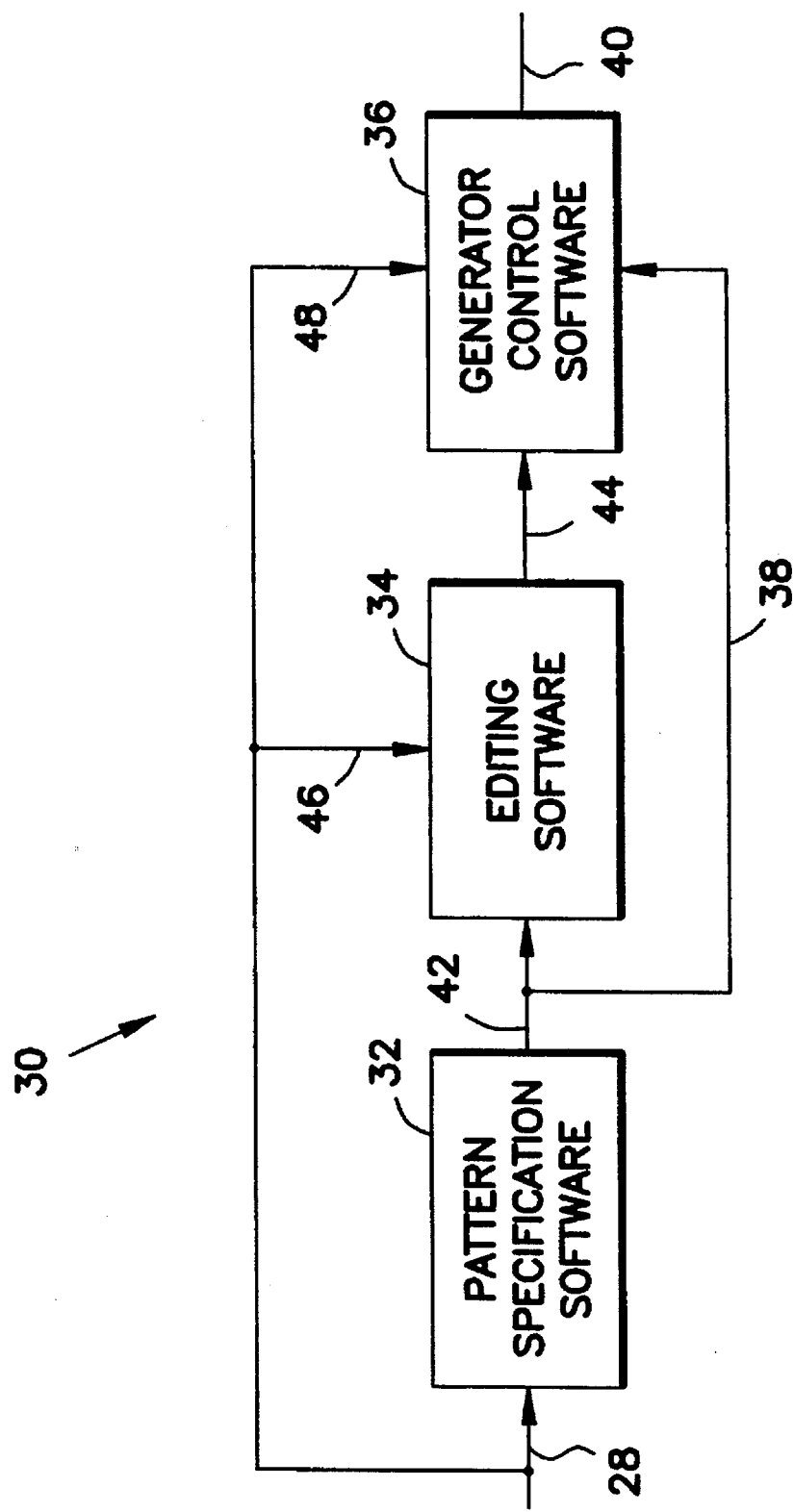
FIG. 2 is a block diagram of the software utilized with the universal pattern generator of FIG. 1.

Software 30 associated with the user programmable unit 12 is shown in block diagram in FIG. 2. The software 30 includes pattern specification software 32 for specifying a repeatable digital signal pattern in conjunction with the use of editing software 34 in response to user input 28 and generating a representative data set 42 of the repeatable specified pattern. The representative repeatable data set 42 is stored in computer RAM of user programmable unit 12. Editing software 34 allows the user through user input 46 to edit the structure of the representative data set 42. Software 30 also includes mark errors software 35 for marking errors in the representative data set 42 through user input and provides for generation of a marked error repeatable data set representative of the data set 42 and the user inputted marked errors applied to generator control software 86 in an additional array of data via line 37. An errored or unerrored repeatable pattern 40 is generated under control of generator control software 36 when the repeatable data set 42 is directly applied thereto via line 38. The pattern 40 is a marked errors pattern when the repeatable data set 42 and an additional array of data via line 37 is applied thereto. Further, under the control of generator control software 36, additional errored patterns are generated via the unerrored, errored, or marked error repeatable data set, as described further below.

The softkeys 20 and corresponding softkey display 90, other keys 22, and display 18, all of user programmable unit 12 form the user interface for generating the digital signal pattern 40. FIGS. 5–9 show various display screens 92 with softkey displays 90 for use in generating the digital patterns. Softkey menu items shown by the softkey displays 90 in the figures shall be understood to represent also the corresponding software components carrying out the menu function. The specification, generation, and transmittal of an errored or unerrored digital signal pattern will be described with particular reference to these screens and softkey displays.

The pattern specification software 32, FIG. 2, when initiated displays a first menu of softkey displays 90, FIG. 5. Depending upon whether the SF, ESF, or SLC softkey is selected a different screen will be displayed therewith. If the SF softkey is selected then display screen 92 of FIG. 5 is displayed. The screen 92 of FIG. 6 is displayed if the ESF key is selected and the display screen 92 of FIG. 7 is displayed if the SLC softkey is selected.

SF, ESF, and SLC represent DS1 rate superframing formats. As is known in the art, the SF superframing format is an assembly of 12 frames, each frame consisting of 24 8-bit samples of conversations, each 8-bit sample forms a separate channel conversation. The frame also includes an extra bit called the F-bit or the frame bit. Thus, each frame includes 193 bits per frame. In the SF superframing format, the F-bits from the odd numbered frames, the "Ft bits" of FIG. 5, are set to the pattern 101010 to allow a receiving device to maintain synchronization with the frames within the superframe. The F-bits from the even numbered frames, the "Fs bits" of FIG. 5, are set to the pattern 001110 to allow a receiving device to identify which frame is the first frame and which is the last frame of a superframe.

FIG. 6 displays the structure of an ESF superframing format screen. As is known in the art, the ESF superframing format is an assembly of 24 frames. The F-bits from frames 4, 8, 12, 16, 20 and 24, the "Fe bits", are set to the pattern 001011. These bits provide frame synchronization and superframe synchronization. The F-bits from frames 2, 6, 10, 14, 18 and 22, the "CRC-6 bits", are used as a check-sum of the previous superframe transmitted. The remaining F-bits, known as "FDL bits", are generally used to relate error rate information.

The last superframing format screen, FIG. 7, shows the SLC, also referred to as SLC-96, superframing format. It is an assembly of six SF superframes. The F-bits from the odd numbered frames, the "Ft bits", are utilized in the same manner as for the SF superframing format. The even numbered F-bits of frames 2–16 and 66–72, the "Fs bits", function like the Fs bits of the SF superframing format. The remaining even Fs bits of frames 18–64 are FDL bits and provide a facility data link, generally used to transmit error rate information as in the ESF superframing format.

In addition, as is known in the art, robbed-bit signalling may be utilized in all three superframing formats to provide communication between the sources and sinks of the system. In the SF format, the 8th bit of every channel in the 6th and 12th frames of every superframe are used as A and B signalling bits. In the ESF format the 8th bit of each channel in the 18th and 24th frames are used in addition to the 8th bits in the 6th and 12th frames to provide A, B, C, and D signalling bits. The SLC format uses the 8th bit in the 6th and 12th frames like that of the SF format, only repeated six times.

Each of these screens, FIGS. 5–7, when selected by the user and under the control of specification software 32, displays the associated superframing structure. When there is no user input, the X's of the display screens 92 default to 1's or FF, the hex code for all ones. When the SF, ESF, or SLC softkey is selected, the associated softkey box is highlighted to indicate that the user is in that particular superframing structure menu. The other softkeys on the main menu remain the same because they are not dependent on whether the SF, ESF, or SLC key is selected.

User input 28 to specify an unerrored repeatable pattern is inputted by the user via the screen and menu of softkeys of FIG. 8 (under control of editing software 34) which appears after the Edit Structure softkey of the screens, FIGS. 5–7, is selected. The data, in hex code, for the channels, robbed-bit signalling, number of super frames, FDL pattern length and FDL content are inputted to specify an unerrored repeatable pattern by using either arrow key navigation around the field, and then entering of data therein on the display, or using certain alphanumeric keys of the user programmable unit. Errors can also be specified as described below.

The Next Channel softkey of the first menu, FIGS. 5–7, increments the channel displayed and displays the data stored in the next channel. The Previous Channel softkey decrements the channel displayed. The Mark Errors softkey will be described below with regard to the mark errors software 35. When the Load QRSS softkey is selected a quasi-random pattern is created and loaded into the transmitter 14, as described further below, for transmission. The quasi-random pattern is generated according to the algorithm, $x15+x14^1+1=0$.

After or while the user is specifying the framing structure and editing the screen fields, via the main menu, FIGS. 5–7, specification software 32, and, edit structure screen, FIG. 8, further definition to the pattern to be generated can be provided through the Edit Structure softkey of the main menu, SF, ESF, or SLC menus, FIGS. 5–7, and softkey menu and screen of FIG. 8 under the control of editing software 34. The edit structure screen 92 and softkeys 90 are the same whether you are in the SF, ESF, or SLC superframing format mode, except that the frame and channel information which correspond to that particular superframing format is displayed. For example, the screen of FIG. 8 displays frame and channel information of the ESF superframing format.

The edit structure screen, FIG. 8, allows the user to edit such parameters as the channel content, robbed-bit signalling, the number of superframes in the pattern, the facility data link (FDL), length and content, as well as the type and quantity of bi-polar violations (BPV's), logic errors, and framing errors. The user can specify, for example, robbed-bit signalling by toggling the signalling function of screen 92, FIG. 8, from the "off" state to the "on" state, then navigating through the field to specify the content of the A, B, C or D bits in each channel by use of arrow key navigation or the other keys to specify data where required.

The Boot Emulator softkey simply boots the emulator which controls the generator in the product as now structured. The AMI softkey allows the user to specify a line code for the pattern. Either AMI, B8ZS, or ZBTSI may be selected. The AMI softkey toggles between each of these selections and AMI line coding is the default setting if another is not selected. The Next Channel and Previous Channel softkeys perform the same functions as before with respect to the main menu, FIGS. 5–7. The Save File softkey allows the user to save the file he just edited or initially specified under a name of his own choosing in computer memory and on disk or other storage media, and the Load File softkey allows the user to call up previously saved files in order to edit them.

Once the user has specified the contents of the pattern by using the screens associated with the edit structure menu, FIG. 8, under control of editing software 34, and the main menu, Figs, 5, 6, or 7, under control of specification software 32, the Edit Framing softkey of the edit structure menu is selected. When selected, a digital data set 42 representative of the repeatable digital signal pattern specified is generated and stored in computer RAM. Selecting the Edit Framing softkey, displays on the screen, frame by frame, the actual binary data set (display not illustrated).

After selecting the Edit Framing softkey, the softkey display associated with the main menu once again is displayed, including the Mark Errors softkey, FIGS. 5, 6, or 7. As the binary data set is displayed frame by frame, the user is allowed to mark F-bits for error generation by highlighting the bit using the arrow keys to navigate on the display and selecting the Mark Errors softkey. The capability of marking errors for generation is under the control of mark errors software 35, FIG. 2. When an error is marked, the actual data set of the repeatable signal pattern 42 does not change but rather a bit is set in an additional data array so that the marked data bit is inverted upon loading of transmitter 14 under control of generator control software 36. The marked data bits are highlighted when the bits are displayed on the main menu, FIG. 5, 6, or 7.

The following table shows representative bytes of an unerrored generated repeatable pattern data set.

TABLE 1

|  | Hex | Binary | Polarity | Bit |
| --- | --- | --- | --- | --- |
| Ordinary unerrored "1" | 01 | 0000 0001 | + | 1 |
| Ordinary unerrored "1", negative polarity because of line coding | 02 | 0000 0010 | – | 1 |
| Ordinary unerrored "0" | 00 | 0000 0000 | NA | 0 |
| "0" with repeat bit set, specifying end of pattern | 80 | 1000 0000 | NA | 0 |

When the user is satisfied with the repeatable pattern he has created and marked, a particular hardkey is selected to initiate the appearance of the generator control menu associated with the generator control software 36, shown by the softkey display 90, FIG. 9. The generator control menu allows the user to exercise control over the generator's pattern switching and error generation capability.

Figure 3:
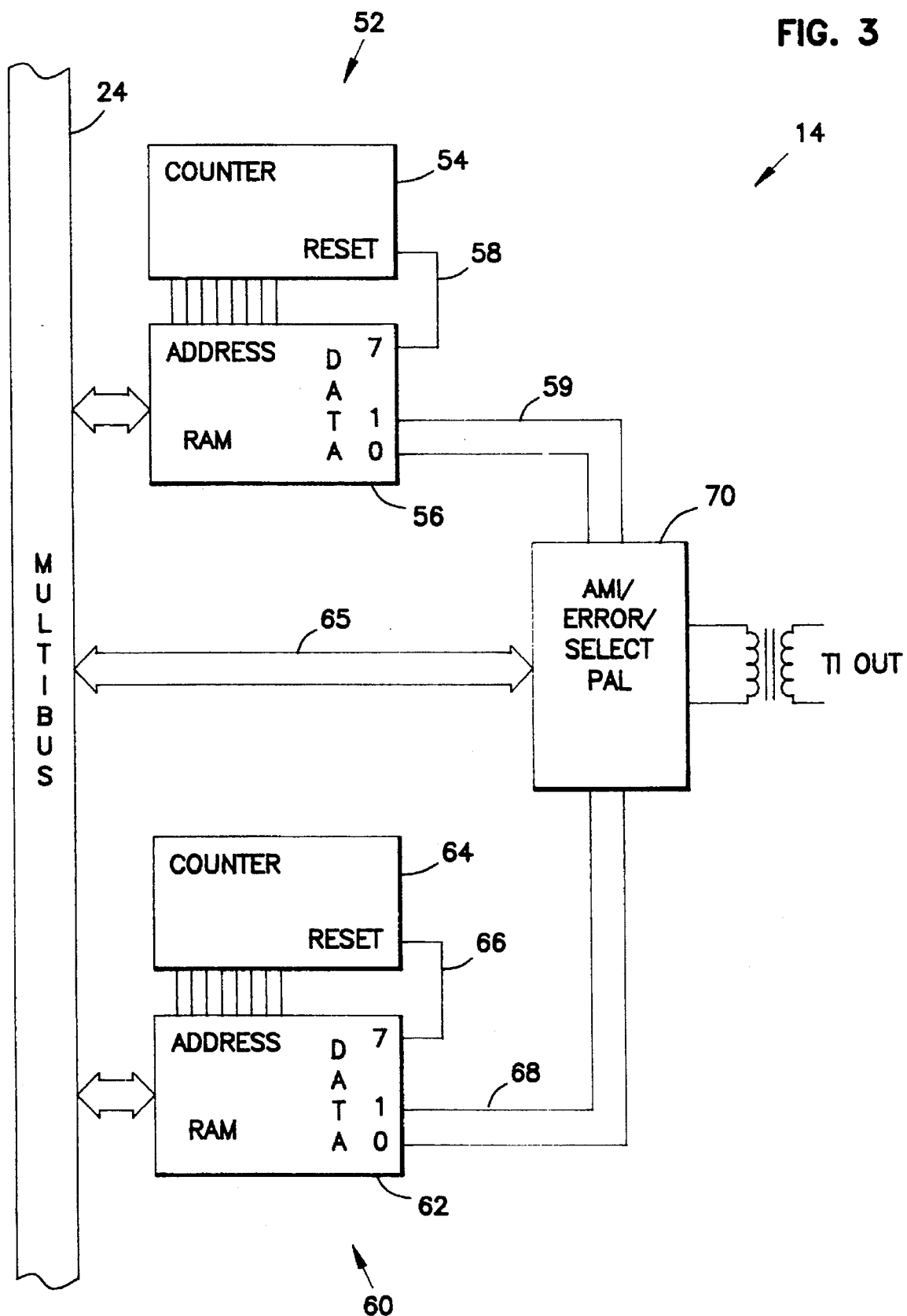
FIG. 3 is a block diagram of a RAM based transmitter of the universal pattern generator of FIG. 1.

FIG. 3 shows the RAM based transmitter for generating and transmitting the digital signal pattern. The RAM based transmitter 14 includes a side A 52 and a side B 60. Both sides operate in the same manner. Side A includes RAM 56 connected to a counter 54, likewise Side B includes RAM 62 and counter 64. The data set 42 representing the repeatable digital pattern is loaded into either side A or side B via the bus 24. Power up initializes either counter 54 or 64 which drives an address bus for addressing the data set. The addressed data is applied to the input of the AMI/ERROR/SELECT PAL 70. The PAL 70 will be described later with regard to error generation. The seventh bit of the last word of data in the data set 42 representing the end of the repeatable digital pattern as shown in Table 1, resets the counters 54 or 64 via lines 58 or 66 so that the data set is repeatedly transmitted.

By selecting the Load Generator softkey, FIG. 9, the data set representative of the presently displayed pattern specified by the user is loaded, under control of software 36, to whichever side of the generator that is not currently being selected for transmission. The line coding specified in the Edit Structure screen and menu, FIG. 8, is performed at this time. The data bits corresponding to the marked errors, if any, are also inverted according to the additional data array created under control of mark errors software 35. This Load Generator softkey remains highlighted until the loading is completed. Thus, if the RAM based transmitter is transmitting from side A 52, then it is possible to load into side B 60. The Load Generator softkey toggles between A and B. The Switch to A softkey, when selected, forces the generator to transmit from side A. This softkey is highlighted when the generator is transmitting therefrom.

The user interface allows the user to load a new pattern into side B as indicated above, during the transmission from side A and indicates this by labeling the softkey Load Generator B. This would of course be true when side B is transmitting, whereby the softkey for loading is labeled Load Generator A. Likewise, the Switch to B softkey forces the generator to transmit from side B and this key is highlighted when the generator is transmitting therefrom.

As previously presented, a digital signal pattern 40 can be generated under control of software 36 once it is specified via pattern description software 32 utilizing editing software 34. This is shown in the software diagram of FIG. 2, wherein loop 38 applies the repeatable digital pattern data set 42 generated by the pattern description software directly to the generator control software 36. This pattern can be generated as specified without errors being introduced therein. The unerrored digital pattern 40 per the user input 48 is generated as specified by the user. Of course, the specified repeatable digital pattern itself could be an errored pattern, thus the RAM based transmitter would transmit an errored pattern without ever generating an unerrored pattern.

The apparatus and software of the present invention interject errors into the specified repeatable digital pattern to generate errored digital signal patterns in a number of ways. As was previously discussed, the Mark Errors softkey of the main menu, FIGS. 5, 6 or 7, allows the user to access the repeatable data set 42 and mark any given framing bit for inversion upon loading and transmission. Marking the error does not invert the actual data bit of the data set stored in computer RAM, but rather a bit is set in an additional array as previously described above and used to invert the bit prior to line coding and when the repeatable data set is loaded in transmitter 14. The data set 42 stored in computer RAM remains unchanged.

In the present invention, software has not been written to allow all the bits, just the framing bits, of the specified repeatable digital pattern to be marked for error generation per the Mark Errors softkey. It should be readily apparent to one skilled in the art that software to mark errors for any of the specified bits can easily be created. The marked error, because the bit in the repeatable digital signal data set is inverted when loaded, prior to transmission and is repeatedly transmitted, occurs every time the specified repeatable pattern is repeatably transmitted.

A logic errored digital signal pattern can also be generated utilizing the Switch A-B-A softkey, or the ALT A-B-A-B softkey, FIG. 9, of the generator control menu. After specifying a repeatable digital signal pattern via the main menu, FIG. 5, 6 or 7, and the edit structure menu, FIG. 8, and then loading the data set representative of that digital signal pattern into side A 60 of RAM based transmitter 14, a duplicate of the digital signal pattern loaded into side A, with an additional logic error created with the Mark Error softkey or Edit Structure software, can be loaded into side B of the transmitter 14. By selecting the Switch A-B-A softkey, one iteration of the errored pattern in side B is transmitted with the digital signal pattern 40 represented by the data set loaded into side A. This provides the capability of single error control without interrupting the pattern framing. With the use of the Switch A-B-A softkey any of the bits of the repeatable digital signal pattern can be errored, including the data bits. This errored pattern is generated under generator control software 36. No additional software is required to produce the single error capabilities. In addition, by selecting the Switch A-B-A-B softkey, the patterns loaded in side A and side B are alternately transmitted.

Both logic errors and line code errors can be generated in the digital signal pattern by means of the edit structure screen and menu, FIG. 8, and the PAL 70, FIG. 4, of RAM based transmitter 14. The edit structure screen, FIG. 8, and pattern specification software 32, allows the user to specify a rate, burst, or single occurrence for a logic error. The edit structure screen, FIG. 8, indicates that the Logic Errors are in the off state, however, the state can be toggled to indicate single, burst or rate errors. When an error rate is selected by the user as the single, burst or rate states are toggled, an additional display, shown as XX, allows the user to enter a desired rate. The same is applicable for the frame error capabilities. The selection of these types of logic errors or frame errors cause errors to occur on the fly. These types of errors are post-line code generated and may disturb any line coding already performed on the data set. When a single, burst, or rate is specified, the user has no control over where the error will occur. When a single, burst, or rate is specified for logic or frame errors, a timer is configured (not shown) which applies, via lines 78 and 80 of in/out 65, signals representative thereof to the binary invertor 86 of PAL 70. The invertor 86 then inverts the digital pattern data set bits applied via data input lines 74 and 76 from output lines 59 or 68.

Line code errors or bi-polar violations (BPV's) are also created by the user with the edit structure screen and menu, FIG. 8, and PAL 70 of transmitter 14. A single, rate or burst BPV occurrence is specified in the same manner as specified for the logic and frame errors discussed above. When a single, burst or rate is specified for BPV errors, a timer is configured (not shown) which applies via line 82 and 84 of in/out 65, signals representative thereof to the AMI encoder 88 of PAL 70. The AMI encoder 88 generates the BPV or line code error in the logic errored or unerrored digital signal pattern, accordingly. The user has no control over where in the pattern this BPV erroring will take place.

As may be appreciated, software could easily be written to allow the user to specify which bits (framing, data, signalling, etc.) in the pattern are to be selected for logic or BPV errors when utilizing the burst, or rate generating capabilities. The hardware of the present invention would support such software.

Although the present invention has been described above in a preferred form, those skilled in the art will readily appreciate that various modifications may be made to it without departing from the spirit and scope of the invention, as bounded by the claims of the application itself.

What is claimed is:

1. A system for generating a digital signal test pattern for use in a T-1 data transmission system carrying primary signals formatted in any one of a plurality of predetermined T-1 framing structures and transmitted in a predetermined T-1 timing, comprising:

user programmable means for allowing a user to specify a repeatable digital signal test pattern, said user programmable means including means for selecting a selected framing structure for said repeatable digital signal test pattern, said selected framing structure corresponding to a selected one of said predetermined T-1 framing structures and having a plurality of channels, and input means for inputting data into said channels of said selected framing structure;

means for generating a data set representing said repeatable digital signal test pattern, said means for generating a data set operatively connected to said user programmable means;

memory means for holding said data set;

transmitting means responsive to said data set held in said memory means for repeatedly transmitting said repeatable digital signal test pattern represented by said data set to a receiving device for testing a performance of said receiving device at a rate selected to correspond to said predetermined T-1 timing;

error means for selecting errors represented by a data entry for said channels inconsistent with said T-1 framing structure; and means for generating error data corresponding to errors selected, said means for generating a data set interjecting errors as a function of said error data.

2. A system for generating a digital signal test pattern for use in a T-1 data transmission system carrying primary signals formatted in any one of a plurality of predetermined T-1 framing structures and transmitted in a predetermined T-1 timing, comprising:

user programmable means for allowing a user to specify a repeatable digital signal test pattern, said user programmable means including means for selecting a selected framing structure for said repeatable digital signal test pattern, said selected framing structure corresponding to a selected one of said predetermined T-1 framing structures and having a plurality of channels, and input means for inputting data into said channels of said selected framing structure;

means for generating a data set representing said repeatable digital signal test pattern, said means for generating a data set operatively connected to said user programmable means;

memory means for holding said data set;

transmitting means responsive to said data set held in said memory means for repeatedly transmitting said repeatable digital signal test pattern represented by said data set to a receiving device for testing a performance of said receiving device at a rate selected to correspond to said predetermined T-1 timing; and error means for interjecting errors into said digital signal pattern.

3. A system according to claim 2, wherein said error means includes means for specifying one of a logic error rate, logic burst errors, and a single logic error for said repeatable digital signal pattern and trigger means for interjecting said one of logic error rate, logic burst errors, and single logic error into said digital signal pattern.

4. A system according to claim 2 wherein said error means includes means for specifying one of a framing error rate, framing burst errors, and a single framing error for said repeatable digital signal pattern and trigger means for interjecting said one of framing error rate, framing burst errors, and single framing error into said digital signal pattern.

5. A system according to claim 2 wherein said error means includes means for specifying one of a line code error rate, line code burst errors, and a single line code error for said repeatable digital signal pattern and trigger means for interjecting said one of line code error rate, line code burst errors, and single line code error into said digital signal pattern.

6. A system for generating a digital signal test pattern for use in a T-1 data transmission system carrying primary signals formatted in any one of a plurality of predetermined T-1 framing structures and transmitted in a predetermined T-1 timing, comprising:

user programmable means for allowing a user to specify a repeatable digital signal test pattern, said user programmable means including means for selecting a selected framing structure for said repeatable digital signal test pattern, said selected framing structure corresponding to a selected one of said predetermined T-1 framing structures and having a plurality of channels, and input means for inputting data into said channels of said selected framing structure;

means for generating a data set representing said repeatable digital signal test pattern, said means for generating a data set operatively connected to said user programmable means;

memory means for holding said data set; and transmitting means responsive to said data set held in said memory means for repeatedly transmitting said repeatable digital signal test pattern represented by said data set to a receiving device for testing a performance of said receiving device at a rate selected to correspond to said predetermined T-1 timing; and said user programmable means including means for selecting at least one of a line code, robbed bit signalling, and data link messages for said repeatable digital signal pattern.

7. A system for generating a digital signal test pattern for use in a T-1 data transmission system carrying primary signals formatted in any one of a plurality of predetermined T-1 framing structures and transmitted in a predetermined T-1 timing, comprising:

user programmable means for allowing a user to specify a repeatable digital signal test pattern, said user programmable means including means for selecting a selected framing structure for said repeatable digital signal test pattern, said selected framing structure corresponding to a selected one of said predetermined T-1 framing structures and having a plurality of channels, and input means for inputting data into said channels of said selected framing structure;

means for generating a data set representing said repeatable digital signal test pattern, said means for generating a data set operatively connected to said user programmable means;

memory means for holding said data set;

transmitting means responsive to said data set held in said memory means for repeatedly transmitting said repeatable digital signal test pattern represented by said data set to a receiving device for testing a performance of said receiving device at a rate selected to correspond to said predetermined T-1 timing; and said transmitting means further comprises an input connected to said memory means for receiving said data set, and wherein an additional data set representing an additional repeatable digital signal pattern is stored in said memory means, and further comprising means for switching the input of said transmitting means between the data set for the repeatable digital signal pattern and the additional data set for the additional repeatable digital signal pattern, so that one iteration of one of said repeatable digital signal pattern and said additional repeatable digital signal pattern represented by said data set and said additional data set, respectively, is interjected into the other one of said repeatable digital signal pattern and said additional repeatable digital signal pattern that is being repeatedly transmitted.

8. A method for generating an errored digital signal pattern for use in a T-1 data transmission system carrying primary signals formatted in any one of a plurality of predetermined T-1 framing structures and transmitted in a predetermined T-1 timing, comprising the steps of:

specifying a repeatable digital signal pattern by:
a) selecting a framing structure for said repeatable digital signal pattern and corresponding to a selected one of said predetermined T-1 framing structures, said framing structure having a plurality of channels; and b) inputting data into said channels of said framing structure;

selecting errors for said data in said channels by selecting a data entry for a channel which is inconsistent with said T-1 framing structure;

generating said errored digital signal pattern by:

i) loading a data set representative of said repeatable digital signal pattern and said selected error data into memory of a transmitter; and ii) repeatably transmitting said repeatable digital signal pattern represented by said data set to a receiving device at a rate selected to correspond to said predetermined T-1 timing for testing a performance of said receiving device.

9. A method according to claim 8 wherein said specifying step further includes selecting at least one of a line code, robbed bit signalling, and data link messages for said repeatable digital signal pattern.

10. A method according to claim 8 wherein said step of specifying a repeatable digital signal pattern includes the step of specifying one of an error rate, burst errors, and a single error for at least one of framing errors, logic errors and line code errors of said repeatable digital signal pattern.

* * * * *